United States Patent
Wang

(10) Patent No.: US 10,897,074 B2
(45) Date of Patent: Jan. 19, 2021

(54) HOUSING, METHOD FOR MANUFACTURING HOUSING, AND MOBILE TERMINAL

(71) Applicant: GUANGDONG OPPO MOBILE TELECOMMUNICATIONS CORP., LTD., Guangdong (CN)

(72) Inventor: Cong Wang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 204 days.

(21) Appl. No.: 16/046,614

(22) Filed: Jul. 26, 2018

(65) Prior Publication Data

US 2019/0103657 A1 Apr. 4, 2019

(30) Foreign Application Priority Data

Sep. 30, 2017 (CN) .......................... 2017 1 0928557
Oct. 31, 2017 (CN) .......................... 2017 1 1042332

(51) Int. Cl.
H05K 5/06 (2006.01)
H01Q 1/24 (2006.01)
(Continued)

(52) U.S. Cl.
CPC ............... *H01Q 1/243* (2013.01); *H01Q 1/36* (2013.01); *H01Q 13/10* (2013.01);
(Continued)

(58) Field of Classification Search
CPC .......... H01Q 1/243; H01Q 1/36; H01Q 13/10;
H01Q 13/106; H01Q 1/24; H04B 1/3888;
H04B 2001/3894; H04M 1/0249; H04M
1/18; H04M 1/026; H05K 5/064; H05K
5/00; H05K 5/02; H05K 5/04; B29C
39/42; B29L 2031/3481; B32B 7/12;
B32B 27/06; B32B 37/12; B32B 38/145
(Continued)

(56) References Cited

U.S. PATENT DOCUMENTS 6,359,235 B1 * 3/2002 Hayashi ............ H01L 23/49894
174/255
6,404,048 B2 * 6/2002 Akram ..................... H01L 23/24
174/252
(Continued)

FOREIGN PATENT DOCUMENTS

CN 104138821 A 11/2014
CN 104735941 A 6/2015
(Continued)

OTHER PUBLICATIONS

First Examination Report in counterpart Indian Patent Application No. 201814031725, dated Feb. 18, 2020 (5 pages).
(Continued)

*Primary Examiner* — Angel R Estrada
(74) *Attorney, Agent, or Firm* — Ladas & Parry LLP

(57) ABSTRACT

A method for manufacturing a housing is described. The methods includes: providing a cover body defining a slot; filling a first material into the slot; and filling a second material into the slot to fill up the slot. A housing and a mobile terminal including the housing are further provided.

20 Claims, 10 Drawing Sheets

(51) Int. Cl.
*H01Q 13/10* (2006.01)
*H04M 1/02* (2006.01)
*H04B 1/3888* (2015.01)
*H01Q 1/36* (2006.01)
H04B 1/38 (2015.01)
B29C 39/42 (2006.01)
B29L 31/34 (2006.01)
H04M 1/18 (2006.01)

(52) U.S. Cl.
CPC ......... *H01Q 13/106* (2013.01); *H04B 1/3888* (2013.01); *H04M 1/0249* (2013.01); *H05K 5/064* (2013.01); *B29C 39/42* (2013.01); *B29L 2031/3481* (2013.01); *H04B 2001/3894* (2013.01); *H04M 1/18* (2013.01)

(58) Field of Classification Search
USPC ..... 174/152 A, 50, 520, 535, 250, 252, 257, 174/260, 255; 361/600, 752, 750, 751; 29/592.1, 592
See application file for complete search history.

(56) References Cited

U.S. PATENT DOCUMENTS

| | | | |
|---|---|---|---|
| 7,989,085 B2* | 8/2011 | Li ....................... | H04M 1/0283 174/50 |
| 10,277,265 B2* | 4/2019 | Yoo ........................... | A45F 5/00 |
| 10,567,563 B2* | 2/2020 | Qian .................. | H04M 1/0249 |
| 2014/0098502 A1 | 4/2014 | Lasarov et al. | |
| 2016/0192456 A1 | 6/2016 | Su et al. | |
| 2017/0012659 A1 | 1/2017 | Kim et al. | |
| 2017/0047959 A1 | 2/2017 | Cater et al. | |
| 2018/0053989 A1 | 2/2018 | Ma et al. | |

FOREIGN PATENT DOCUMENTS

| | | |
|---|---|---|
| CN | 105344554 A | 2/2016 |
| CN | 105517389 A | 4/2016 |
| CN | 105530788 A | 4/2016 |
| CN | 105813422 A | 7/2016 |
| CN | 105855127 A | 8/2016 |
| CN | 105979741 A | 9/2016 |
| CN | 205657168 U | 10/2016 |
| CN | 106159132 A | 11/2016 |
| CN | 106231013 A | 12/2016 |
| CN | 106550070 A | 3/2017 |
| CN | 106900150 A | 6/2017 |
| CN | 206353801 U | 7/2017 |
| WO | 2014048665 A1 | 4/2014 |
| WO | WO2018033053 A1 | 2/2018 |

OTHER PUBLICATIONS

First Office Action from China patent office in counterpart Chinese Patent Application No. 201711042332.6, dated Mar. 1, 2019 (14 pages).
European search report for Application No. EP18187437.1, dated Feb. 14, 2019 (10 pages).
Chinese first Office Action for Application No. CN 201710928557.5, dated Feb. 25, 2019 (12 pages).
Chinese second Office Action for Application No. CN 201710928557.5, dated Apr. 30, 2019 (10 pages).

* cited by examiner

US 10,897,074 B2

HOUSING, METHOD FOR MANUFACTURING HOUSING, AND MOBILE TERMINAL

CROSS REFERENCE TO RELATED APPLICATIONS

This application claims priorities to Chinese Patent Application No. 201710928557.5, filed on Sep. 30, 2017, and Chinese Patent Application No. 201711042332.6, filed on Oct. 31, 2017, the contents of which are herein incorporated by reference in their entireties.

TECHNICAL FIELD

The described embodiments relate to mobile terminals, and in particular to a housing, a method for manufacturing the housing, and a mobile terminal.

BACKGROUND

At present, slots are generally defined on a housing of a mobile terminal, in order to install functional components or transmit optical signals, electrical signals, and the like. Based on this structure, in order to ensure the overall appearance and dustproof and waterproof performances of the housing, material needs to be filled into the slots in order to seal the slots.

BRIEF DESCRIPTION OF THE DRAWINGS

In order to make the technical solution described in the embodiments of the present disclosure more clear, the drawings used for the description of the embodiments will be briefly described. Apparently, the drawings described below are only for illustration but not for limitation. It should be understood that, one skilled in the art may acquire other drawings based on these drawings, without making any inventive work.

DETAILED DESCRIPTION

Figure 1:
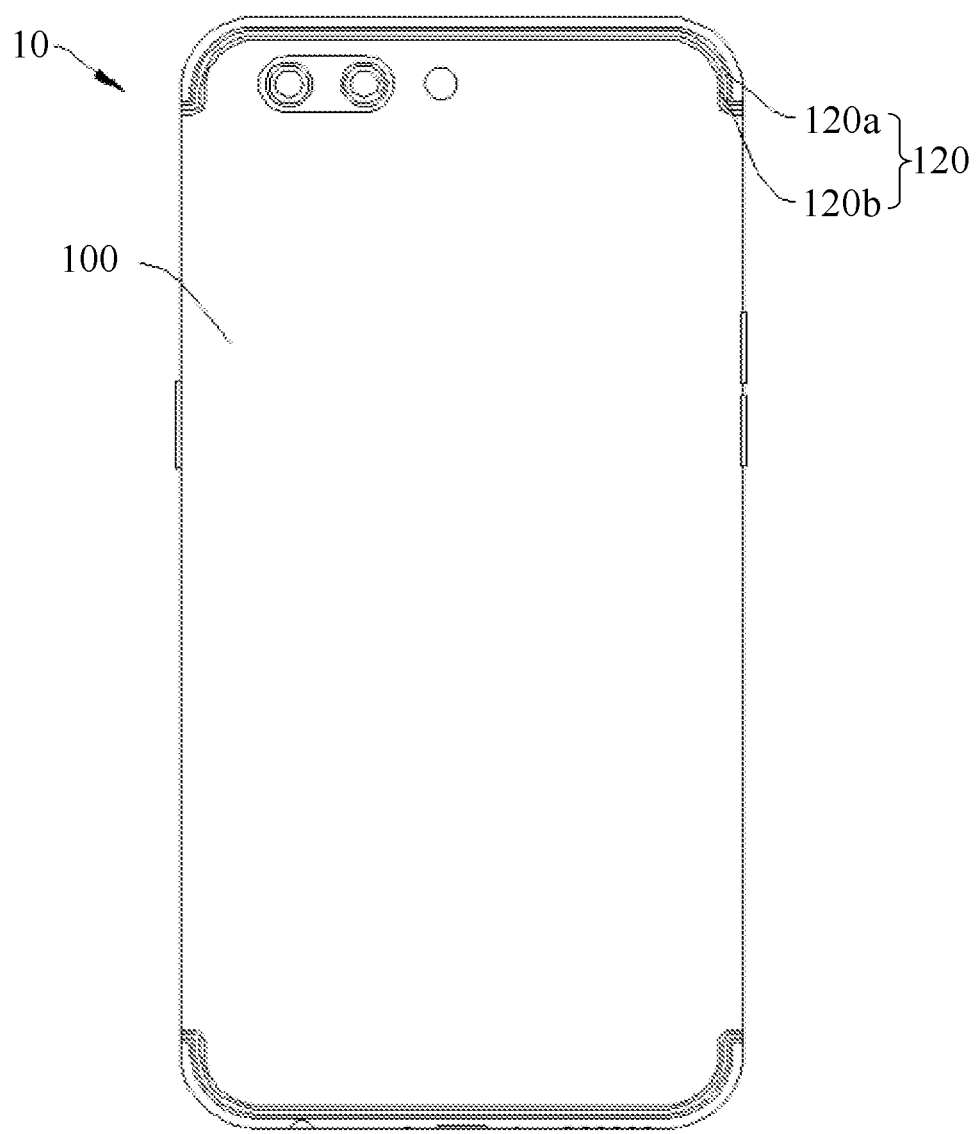
FIG. 1 illustrates a schematic view of a mobile terminal according to an embodiment of the present disclosure.

The technical solutions of embodiments of the present disclosure will be described clearly and completely with reference to the drawings of the embodiments. Apparently, the embodiments described here are only some exemplary embodiments, not all the embodiments. Based on the embodiments described in the present disclosure, one skilled in the art may acquire all other embodiments without making creative efforts. All these shall be covered within the protection scope of the present disclosure.

Besides, the embodiments are described with reference to the accompanying drawings, in order to illustrate specific embodiments of the present disclosure that can be implemented. In the specification, directional terms recited in the present disclosure, such as "top", "bottom", "upper", "lower", "front", "rear", "left", "right", "inner", "outer", "side", and the like, refer to only the orientations in the accompanying drawings. Thus, the directional terms used here are only for better and more clearly describing and understanding the present disclosure, and are not intended to indicate or imply that the devices or the elements are disposed to locate at the specific directions or are structured and performed in the specific directions, which could not to be understood as limiting the present disclosure.

In addition, a numerical range represented by "~" in this specification refers to the range which includes two numerical values respectively recited before and after "~", and respectively used as a minimum value and a maximum value. In the drawings, components having similar or identical structures are denoted by the same reference numerals.

Further, terms such as "first", "second", "third", and the like are used herein for purposes of description, and are not intended to indicate or imply relative importance or significance or to imply the number of indicated technical features. Thus, the feature defined with "first", "second", "third", and the like may include one or more of such a feature. In the description of the present disclosure, "a plurality of" means two or more, unless specified otherwise. Moreover, the terms "comprise", "include" or any other variations thereof are meant to cover non-exclusive including, so that the process, method, article or device comprising a series of elements do not only include those elements, but also include other elements that are not explicitly listed or also include the inherent elements of the process, method, article or device. In the case that there are no more restrictions, an element qualified by the statement "comprises a . . . " does not exclude the presence of additional identical elements in the process, method, article or device that includes the said element.

In one aspect of the present disclosure, as shown in FIG. 1, a mobile terminal 10 provided in embodiments of the present disclosure will be described with reference to drawings.

The mobile terminal 10 may be any device having a communication function and a storage function, such as an intelligent device having a network function including a tablet computer, a mobile phone, an e-reader, a remote controller, a personal computer (PC), a notebook computer, an in-vehicle device, a network TV, a wearable device, and the like. It should be understood that "mobile terminal 10" in the present disclosure may include, but be not limited to a device receiving/transmitting communication signals via wired connection, for example, public switched telephone network (PSTN), digital subscriber line (DSL), digital cable, electric cable and/or another data connection/network, and/or cellular network, Wireless Area Networks (WLAN), digital television network such as DVB-H (Digital Video Broadcasting Handheld) network, satellite network, AM-FM broadcast transmitter and/or another communication terminal of wireless interface. The mobile terminal may also include a satellite or cellular telephone, a personal communication system terminal with cellular radio telephone and data processing, facsimile and data communication, beeper, or other electronic apparatuses with a transceiver.

FIG. 1 illustrates a schematic view of a mobile terminal 10 according to an embodiment of the present disclosure. Referring to FIG. 1, the mobile terminal 10 may include a screen (not shown here), a housing 100 defining a slot 120, and an antenna (not labeled here) received in the housing 100. The housing 100 may be engaged with the screen to define a chamber for receiving components (including the antenna), and configured to encapsulate the components. The antenna may transmit and receive signals through the slot 120.

Figure 2:
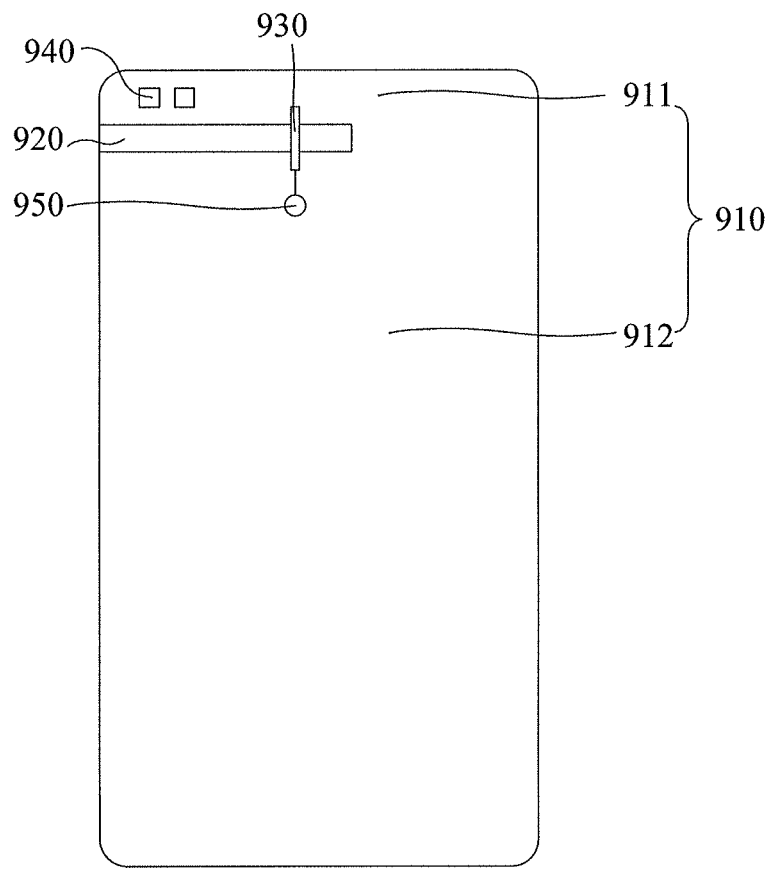
FIG. 2 illustrate a schematic view illustrating an antenna according to an embodiment of the present disclosure.

Alternatively, the antenna may be a slot antenna. As shown in FIG. 2, in this embodiment, the mobile terminal may further include a metal piece 910 defining a radiation slot 920, a feeding terminal 930 spanning across the radiation slot 920, and at least one connection member 940. The metal piece 910 may include a first portion 911 and a second portion 912, and the radiation slot 920 may be formed between the first portion 911 and the second portion 912. The first portion 911 in this embodiment may be used as a radiator of the slot antenna. One end of the feeding terminal 930 may further be coupled to the first portion 911, and the other end of the feeding terminal 930 may be coupled to a power supply 950. The at least one connection member 940 may couple the first portion 911 to the housing 100. The slot antenna may be formed by the first portion 911, the radiation slot 920, the feeding terminal 930 and the at least one connection member 940.

It should be understood that, in other embodiments, the antenna received in the housing 100 may be the one of any other type, such as a PIFA (Planar Inverted-F Antenna), an IFA (Inverted-F Antenna), a monopole, a loop antenna, and the like.

Figure 3:
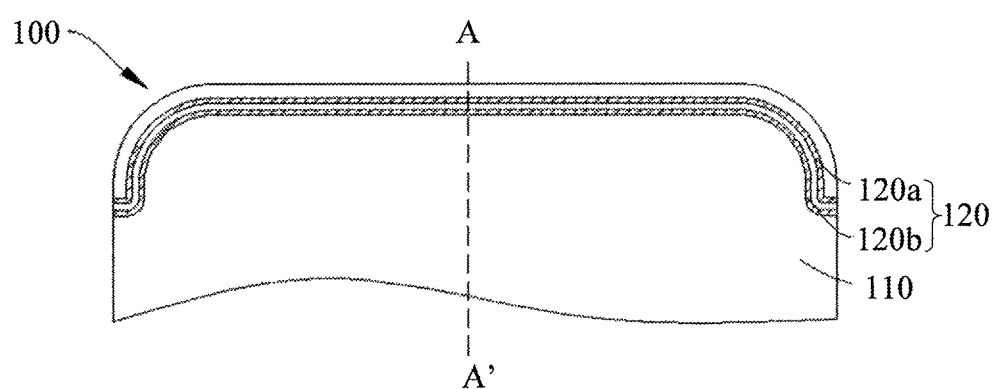
FIG. 3 illustrates a partially enlarged view of a housing of the mobile terminal according to an embodiment of the present disclosure.
Figure 4:
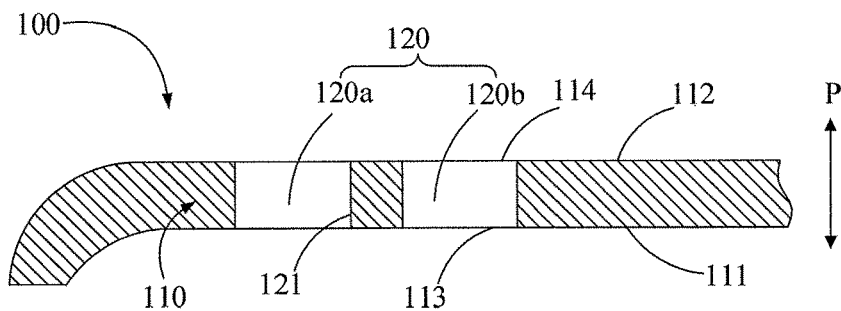
FIG. 4 illustrates a sectional view along line AA' of FIG. 3, wherein two slots without being filled with material are shown.

In this embodiment, as shown in FIGS. 1 and 3-4, a plurality of slots 120 (such as slot 120a and slot 120b in FIGS. 1 and 3-4) may be defined in the housing 100. However, it is also possible to define only one slot in the housing 100. The number of the slots 120 may not be limited in the present disclosure. Likewise, the shape of the slot 120 may also not be limited in the present disclosure. For example, the slot 120 may be a strip-shaped through hole, a circular through-hole, a square through-hole, an irregular-shaped through-hole, and the like. In this embodiment, a width of the slot 120 or an inner diameter of the through-hole may be less than 0.3 mm. Further, in this embodiment, the slot 120 may be defined at the edge of the housing 100, as shown in FIGS. 1 and 3. However, in other embodiment, the slot 120 may also be defined in the middle of the housing 100. Therefore, the number, the shape, the dimension, the position, and the like of the slot 120 are not limited in the present disclosure. In fact, any slot known in the art formed for the antenna is applicable here, as long as the slot is aligned with a built-in antenna in the mobile terminal 10 and enables signal transmission and reception.

FIG. 3 illustrates a partially enlarged view of the housing 100 of the mobile terminal 10 in FIG. 1, FIG. 4 illustrates a sectional view along line AA' in FIG. 3, wherein two slots without being filled with material are shown. Referring to FIG. 3 and FIG. 4, the housing 100 may include a cover body 110, and the slot 120 may be defined in the cover body 110.

In one embodiment of the present disclosure, the cover body 110 may be made of metal. The metal used for making the cover body 110 may not be limited, and may be any metal known in the art capable of being used for forming the housing 100 of the mobile terminal 10. For example, the metal may include, but be not limited to aluminum, aluminum alloy, stainless steel, and the like.

Further, in this embodiment, the cover body 110 may be in shape of a cuboid. However the shape of the cover body 110 may not be limited herein. In fact, the cover body 110 may be flexibly shaped by one skilled in the art, as long as the cover body 110 can be mated with other members (such as the screen described above) to constitute the mobile terminal 10.

In this embodiment, referring to FIG. 4, the cover body 110 may have a thickness direction P1, and may include a first surface 111 and a second surface 112 opposite to each other and separated from each other along the thickness direction P1. More specifically, the first surface 111 may be an inner surface that is oriented towards the components received in the chamber. Here, the term "inner surface" may be intended to mean that, the first surface 111 may not be seen from outside when the assembly of the whole mobile terminal is finished.

As shown in FIG. 4, the slot 120 may extend through the cover body 110 from the first surface 111 to the second surface 112 along the thickness direction P1 of the cover body 110, such that a first opening 113 may be formed on the first surface 111, while a second opening 114 may be formed on the second surface 112.

Figure 5:
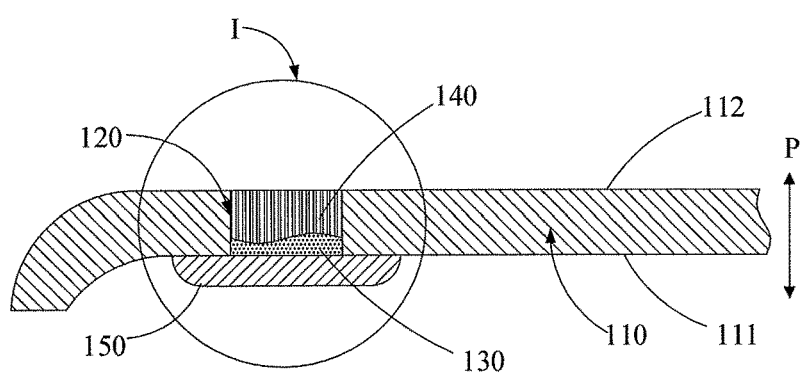
FIG. 5 illustrates a partial sectional view of a housing according to another embodiment of the present disclosure, wherein only one slot filled with the material is shown.
Figure 6:
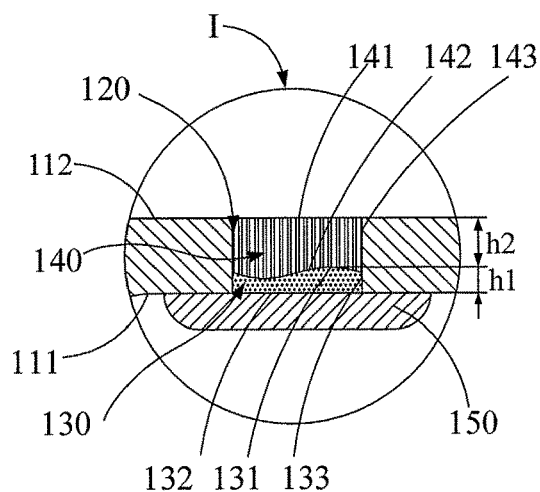
FIG. 6 illustrates an enlarged view of portion I of FIG. 5 according to one embodiment of the present disclosure.

FIG. 5 illustrates a partial sectional view of a housing according to another embodiment of the present disclosure, wherein only one slot 120 filled with the material is shown. FIG. 6 is an enlarged view of portion I of FIG. 5 according to one embodiment of the present disclosure. Referring to FIG. 5 and FIG. 6, the housing 100 may further include a first sealing member 130 and a second sealing member 140 arranged in the slot 120 and configured to seal the slot 120. More specifically, combing with FIG. 4, the first sealing member 130 may be disposed closer to the first surface 111 than the second sealing member 140, and configured to seal the first opening 113. The second sealing member 140 may be stacked on the first sealing member 130 along the thickness direction P1 of the cover body 110, cover at least parts of the first sealing member 130, and located between the first sealing member 130 and the second surface 112. The second sealing member 140 may be configured to seal the second opening 114. Alternatively, the second sealing member 140 may completely cover the first sealing member 130.

As is known in the art, the cover body 110 made of metal may shield electromagnetic waves, as a result of which the built-in antenna of the mobile terminal 10 cannot receive and transmit electrical signals. In order to overcome the shielding of the electromagnetic waves by the cover body 110 of the mobile terminal 10, the slot 120 may be defined in the metal cover body 110, such that the built-in antenna of the mobile terminal 10 may radiate signals through the slot 120. A material may be further filled in the metal cover body 110, such that the metal cover body 110 may be sealed off. In the art, however, since the filling material has a poor fluidity, it may cause problems such as untight sealing, bubble generation, and the like, during the process of filling the slot 120, thereby affecting the overall performance of the housing 100.

However, in this embodiment of the present disclosure, as described above, the slot 120 may be sealed by the first sealing member 130 and the second sealing member 140. More specifically, the first sealing member 130 may include a first material, and the second sealing member 140 may include a second material. Both the first material and the second material may be liquid glue, and have a good fluidity. The first material may be firstly filled into the slot 120 to form the first sealing member 130, and then the second material may be disposed on the first sealing member 130 to form the second sealing member 140. The first sealing member 130 and the second sealing member 140 may finally fill up the slot 120. Since the first material does not fill up the slot 120 after being filled in the slot 120, the first material may sufficiently flow to any corner in the slot 120 or below the cover body 110, such that the first material may be filled in at least one chamber and/or at least one recess defined below the first surface 111 and communicating with the slot 120. In this way, it is possible to prevent the bubble from being generated at a lower portion of the slot 120, and overcome the problems such as glue leakage caused by underfill of the chamber and the like, which in turns improve the overall performance of the housing 100 of the mobile terminal 10.

In this case, the slot 120 may have an upper portion and the lower portion. The first sealing member 130 may be disposed in the lower portion, while the second sealing member 140 may be disposed in the upper portion. Herein, the upper portion may refer to the portion that is close to the second surface 112, while the lower portion of the slot may refer to the portion that is close to the first surface 111.

In an alternative embodiment, referring to FIG. 6, a thickness h1 of the first sealing member 130 may be less than a thickness h2 of the second sealing member 140. This implementation can be achieved by controlling a filling amount of the first material to be less than a filling amount of the second material. Alternatively, a maximum thickness of the first sealing member 130 may be less than a minimum thickness of the second sealing member 140, as shown in FIG. 6.

In this embodiment of the present disclosure, the filling amount of the first material may not be limited. Alternatively, in the case that at least one chamber and/or at least one recess is defined below the first surface 111, when the first material is filled into the at least one chamber and/or the at least one recess, the filling amount of the first material may be as little as possible.

In this embodiment, the first material may include the material the same as or different from the material included in the second material. More specifically, the filling amount of the first material may be set to be less than the filling amount of the second material. In this way, the first material may have a good fluidity, such that the first material may flow to any corner below the first surface or the lower portion of the slot 120. After the first sealing member 130 is formed, the first sealing member 130 may be closely adhered to the lower portion of the slot 120. In this way, defects present between the first sealing member 130 and the lower portion of the slot 120, such as the chamber, the bubble, and the like may be reduced, thereby avoiding the problems such as cracks in the sealing member or the glue leakage caused by the defects including the chamber, the bubble, and the like.

In another alternative embodiment, a viscosity of the first material may be less than a viscosity of the second material.

In this embodiment, the first material may include the material different from the material included in the second material, and the viscosity of the first material may be less than the viscosity of the second material. Therefore, the first material may have a better fluidity than the second material, such that after the first material is filled in the slot 120, the first material may flow to and further fill into the chamber, the recess, and the like below the first surface 111, thereby reducing the defects, including the bubble, the poor sealing, the glue leakage, and the like resulted in the process of filling the slot 120.

Alternatively, the second sealing member 140 may include colorant. The colorant may be added into the second material and mixed with the second material evenly. In this way, the second material may appear to be white, gold, silver, and the like. As a result, after the second sealing member 140 is formed, a colored encapsulation band may be formed by the second sealing member 140, and serve as a marker and a decoration. In addition, by adding the colorant added the second sealing member 140, the formed colored encapsulation band may have a color consistent with that of the housing 100. In this way, after the housing 100 has been manufactured, it is possible to ensure a uniformity in appearance of the housing 100.

Further, referring to FIGS. 5-6, the first sealing member 130 may include a first upper surface 131, a first lower surface 132 opposite to the first upper surface 131, and a first side surface 133 connected between the first upper surface 131 and the first lower surface 132. In this embodiment, the first lower surface 132 may be closer to the first surface 111 than the first upper surface 131. The first lower surface 132 may be substantially at the same level with the first surface 111. Combing with FIG. 4 and FIG. 6, the slot 120 may also include an inner surface 121 connected between the first opening 113 and the second opening 114, and the first side surface 133 may be attached to the inner surface 121.

Referring to FIGS. 5-6, the second sealing member 140 may include a second upper surface 141, a second lower surface 142 opposite to the second upper surface 141, and a second side surface 143 connected between the second upper surface 141 and the second lower surface 142. The second upper surface 141 may be closer to the second surface 112 than the second lower surface 142. More specifically, the second upper surface 141 may be substantially at the same level with the second surface 112 of the cover body 110, and smoothly connected with the second surface 112. In this way, it is possible to increase the touch smoothness of the second surface 112 of the cover body 110, thereby increasing user experience. The second lower surface 142 may be attached to the first upper surface 131, and the second side surface 143 may be attached to the inner surface 121 of the slot 120.

In this embodiment, the second sealing member 140 may be sufficiently filled in the upper portion of the slot 120 that is defined by the first sealing member 130, the inner surface 121 of the slot 120 and the second surface 112, and further fill up the slot 120. In this way, it is possible to ensure the sealing performance at the slot 120 of the cover body 110.

Furthermore, referring to FIGS. 4-6, the housing 100 may further include a base 150 attached to the first surface 111 and covering the slot 120 at the first surface 111. That is, the base 150 may be configured to cover the first opening 113. The base 150 may be further configured to position other components on the first surface 111. The first sealing member 130 may be disposed on the base 150, and more specifically, the first lower surface 132 may be attached to the base 150, thereby providing the sealing between the base 150 and the first opening 113.

Alternatively, the base 150 may be made of, but be not limited to plastic materials such as rubber, resin, and the like. The base 150 may be attached to the first surface 111 by means of injection. Since the cover body 110 may be made of metal, while the base 150 may be made of plastic materials, it means that the material of base 150 is different from that of the cover body 110. In this way, when filling the first material and the second material into the slot 120, the base 150 will not damage mechanical properties of the cover body 110. After the first material and the second material are filled in the slot 120, and the first sealing member 130 and the second sealing member 140 are formed, the base 150 may be easily removed, for example, by means of cutting, without any difficulty.

In one alternative embodiment, since the materials of the cover body 110 and the base 150 are different from each other, it is possible that the bonding reliability between the cover body 110 and the base 150 is poor. Therefore, at least one chamber and/or at least one recess may be defined in the housing 100.

Figure 7:
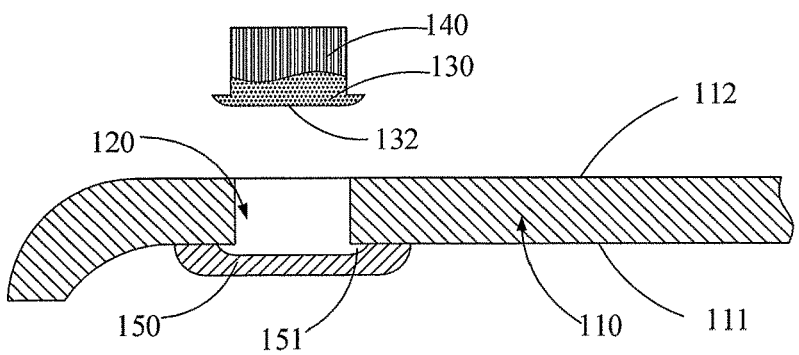
FIG. 7 is a partially explored sectional view of a housing according to a further embodiment of the present disclosure, wherein only one slot is shown.
Figure 8:
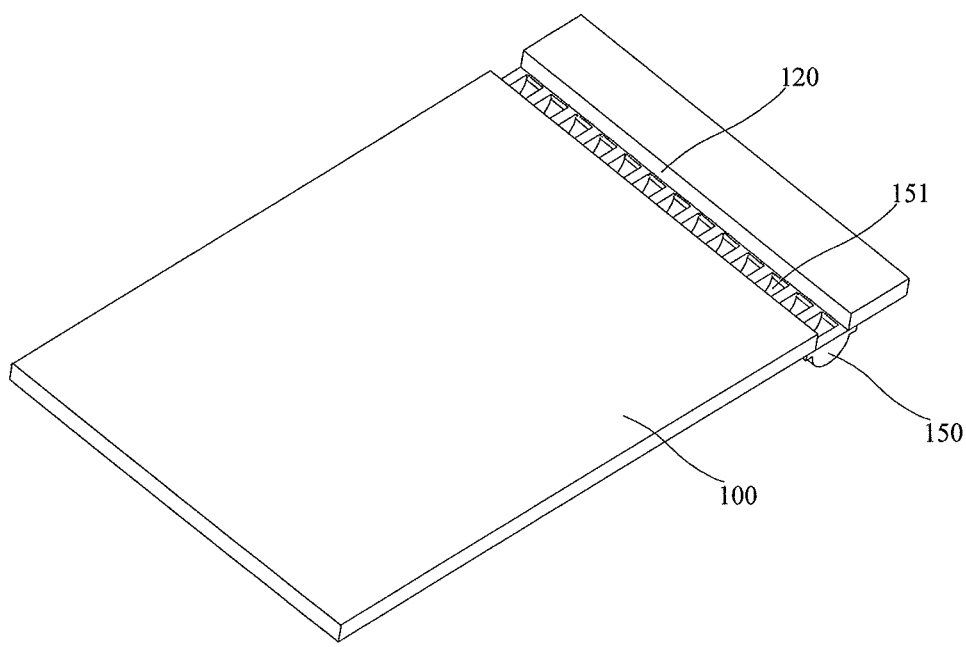
FIG. 8 illustrates a perspective view of a housing according to a still further embodiment of the present disclosure, wherein only one slot filled with the material is shown.

In this embodiment, referring to FIGS. 7-8, at least one chamber 151 communicating with the slot 120 may be defined in the housing 100. The at least one chamber 151 may be defined by the base 150 and the first surface 111 of the cover body 110, and the first sealing member 130 may be filled in the at least one chamber 151.

In this embodiment, since the first material has a good fluidity, the first material may flow into the at least one chamber 151 during the filling process of the first material, such that the first sealing member 130 may be filled in the at least one chamber 151. In this way, it is possible to reduce the sealing defects between the base 150 and the cover body 110.

More specifically, the first lower surface 132 may be attached to the at least one chamber 151. In this implementation, by attaching the first lower surface 132 to the base 150, and attaching the first side surface 133 to the inner surface 121 of the slot 120, the first sealing member 130 may be sufficiently filled in the at least one chamber 151, thereby avoiding a reduction of the sealing effect between the base 150 and the slot 120 due to the bubble or unfilled portion generated between the base 150 and the first surface 111, and avoiding the problem that the base 150 easily falls off the cover body 110 and the like from occurring. In this way, it is possible to provide the sealing between the first surface 111 and the base 150, thereby improving the sealing between the cover body 110 and the base 150.

More specifically, in one implementation, referring to FIG. 7, one chamber 151 communicating with the slot 120 may be defined in the housing 100 and by the base 150 and the cover body 110. In another implementation, referring to FIG. 8, it is also possible to define at least two chambers 151 in the housing 100. The at least two chambers 151 may all communicate with the slot 120. Therefore, the number of the chambers 151 defined in the base 150 may not be limited in the present disclosure.

Figure 9:
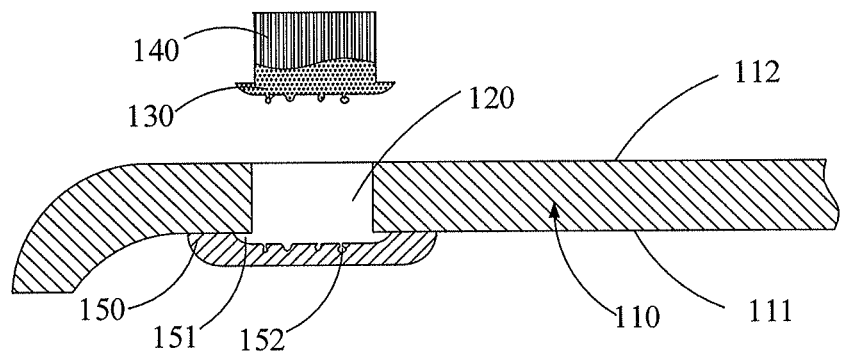
FIG. 9 illustrates a perspective view of the housing according to a further embodiment of the present disclosure, wherein a plurality of chambers are shown.

In another embodiment, referring to FIG. 9, at least one recess 152 may be defined in the base 150. More specifically, the at least one recess 152 may be recessed from a surface of the base 150 that is oriented towards the first opening 113. The at least one recess 152 may further communicate with the slot 120, and the first sealing member 130 may be filled in the at least one recess 152. During the injection forming of the base 150, some pores may be formed in the base 150. After the slot 120 has been defined, the pores will be present below the lower portion of the slot 120, and thus the at least one recess 152 may be formed.

In this embodiment, since the first material has a good fluidity, the first material may flow into the at least one recess 152 during the filling process of the first material, such that the first sealing member 130 may be filled in the at least one recess 152. In this way, it is possible to reduce the sealing defects generated between the base 150 and the cover body 110.

Figure 10:
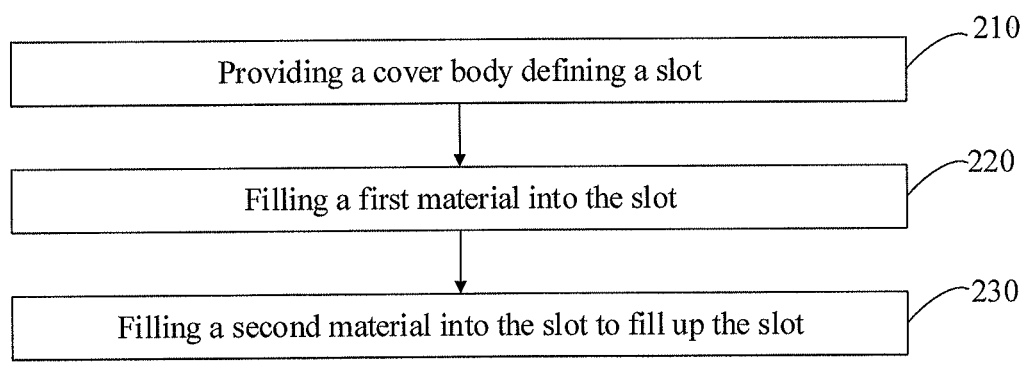
FIG. 10 illustrates a flow chart illustrating a method for manufacturing the housing according to one embodiment of the present disclosure.

More specifically, in one implementation, referring to FIG. 9, four recesses 152 communicating with the slot 120 may be defined in the base 150. In another implementation, it is also possible to define only one recess in the base 150. Therefore, the number of the recesses defined in the base 150 may not be limited in the present disclosure. In another aspect of the present disclosure, a method for manufacturing a housing may be further provided. FIG. 10 is a flow chart illustrating the method for manufacturing the housing according to one embodiment of the present disclosure. The method may be used to manufacture the housing 100 described in any embodiment described above. Referring to FIG. 10, and combing with FIGS. 12-15, the method may include the following blocks.

At block 210: a cover body 110 defining a slot 120 may be provided. Alternatively, referring to FIG. 13, the cover body 110 may have a thickness direction P1, and may include a first surface 111 and a second surface 112 opposite to each other and separated from each other along the thickness direction P1.

In this embodiment, the cover body 110 may be made of metal. The metal may include, but be not limited to aluminum, aluminum alloy, stainless steel and the like, as described above.

Alternatively, the cover body 110 may be formed by using a computer numerical control machine (CNC) to perform mechanical processes, such as milling, grinding, cutting, and the like on a metal blank.

Figure 11:
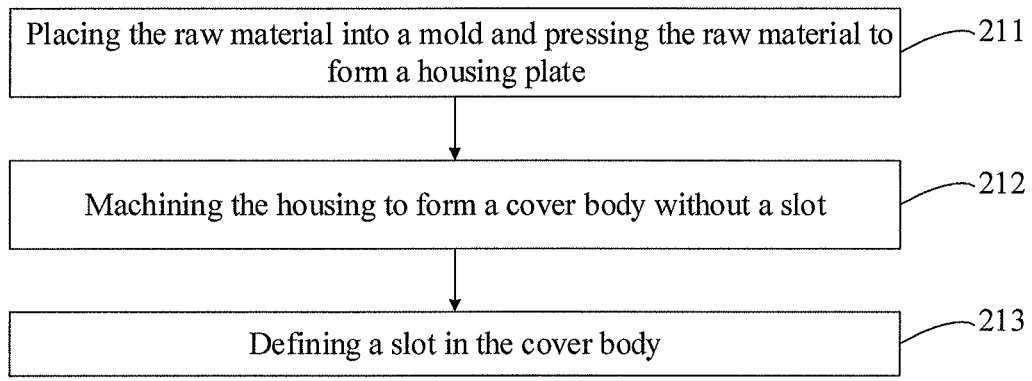
FIG. 11 illustrates a flow chart of block 210 according to one embodiment of the present disclosure.

In one implementation, referring to FIG. 11, the forming process of the cover body 110 may include the following blocks.

At block 211: raw material (a piece of metal) may be placed into a mold and pressed, in order to form a housing plate; the housing plate may have an even thickness. It will be appreciated that, the raw material may be pressed once or many times before the housing plate is formed. Alternatively, before the raw material is placed into the mold, the raw material may be cut.

Figure 12:
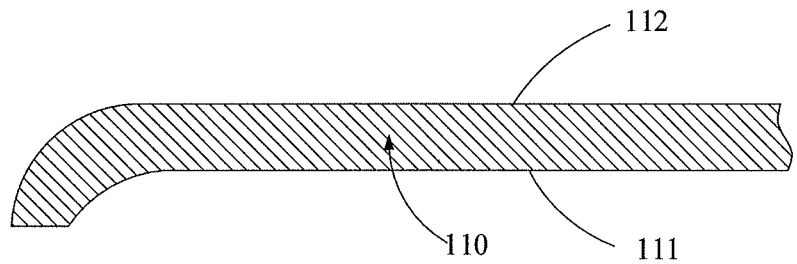
FIGS. 12~15 illustrate structural views corresponding to the method for manufacturing the housing according to the embodiment of present disclosure.

At block 212: the housing plate may be machined, in order to form a cover body 110 without a slot, as shown in FIG. 12. In this embodiment, the housing plate may be machined by using the CNC machine. Certainly, in other embodiment, the housing plate may be machined by using other apparatuses, such as a grinder, a cutting machine, and the like. Further, the machining method may include, but be not limited to lathing, milling, grinding, cutting, and the like.

Alternatively, when the cover body 110 without a slot is formed, the quality of the cover body 110 may be further detected to determine whether the quality of the cover body 110 is acceptable and whether the cover body 110 can be used to manufacture the housing 100. If the cover body 110 meets the quality requirements, subsequent operations may be performed on the cover body 110; otherwise, it is necessary to replace the cover body 110, in order to avoid the quality of the housing 100 manufactured later from being affected by the cover body 110 having bad quality, and extend the entire life of the mobile terminal 10.

Figure 13:
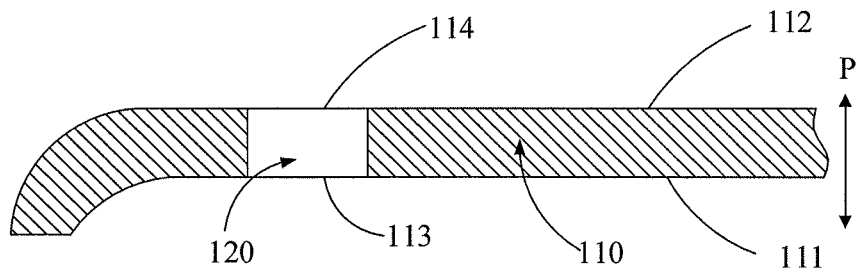

At block 213: a slot 120 may be defined in the cover body 110, as shown in FIG. 13.

More specifically, the slot 120 may extend through the cover body 110 from the first surface 111 to the second surface 112 along the thickness direction P1 of the cover body 110, such that a first opening 113 may be formed on the first surface 111, while a second opening 114 may be formed on the second surface 112.

The number, the shape, the dimension, the position, and the like of the slot 120 have been descried in the description of the aforesaid embodiments, and will not be described in detail any more.

Alternatively, after the cover body 110 is provided, the method may further include the block at which the cover body 110 may be cleaned, in order to remove burrs and smudges on surfaces of the cover body 110.

Figure 14:
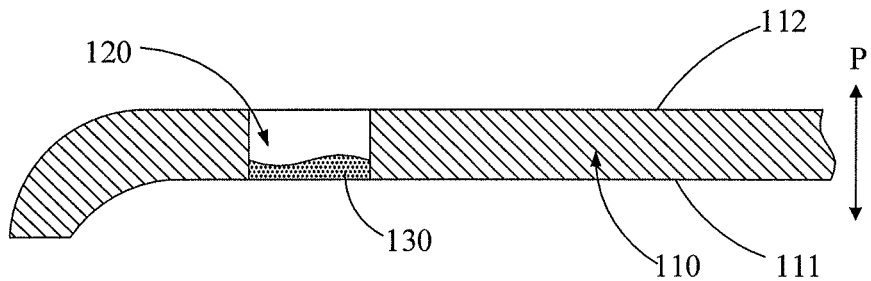

At block 220: a first material may be filled into the slot 120, as shown in FIGS. 10 and 14. The first material does not fill up the slot 120 at this block.

In this embodiment, the first material may be filled into the slot 120 along a direction from the second surface 112 to the first surface 111, such that the first material may be filled in the lower portion of the slot 120.

Alternatively, the first surface 111 and the second surface 112 may be in the same status in the present disclosure, and there is no distinction between priority of the first surface 111 and that of the second surface 112. In this embodiment, the material may be filled into the slot 120 from the second surface 112 to the first surface 111, in order to form the first sealing member. However, the first material may also be filled into the slot 120 from the first surface 111 to the second surface 112. The surface from which the first material is filled into the slot 120 may not be limited in the present disclosure.

More specifically, the first material may be the liquid glue, and have a good fluidity. Besides, the first material does not fill up the slot 120, and the first material may sufficiently flow to any corner in the slot 120 or below the cover body 110, such that the first material may be filled in at least one chamber and/or at least one recess defined below the first surface 11 and communicating with the slot 120. In this way, it is possible to prevent the bubble from being generated at the lower portion of the slot 120, and overcome the problems such as glue leakage or shortage caused by the underfill of the chamber and the like, which in turns improve the overall performance of the housing 100 of the mobile terminal 10. Therefore, it is possible to ensure that the cover body 110 may have better waterproof and dustproof functions, and the sealing effect of the whole mobile terminal 10 may be improved.

Alternatively, the first material may be filled into the slot 120 by using a dispenser. Certainly, the first material may be filled into the slot 120 by other methods. The methods for filling the first material into the slot 120 along the direction from the second surface 112 to the first surface 111 may not be limited in the present disclosure.

In addition, it should be noted that, the number of the dispensers may not be limited in the present disclosure. One dispenser or a plurality of dispensers may be provided in the present disclosure. More specifically, the number of the dispensers may be determined in conjunction with the filling effect of the first material. For example, if a large number of the slots 120 are defined, and a great amount of first material needs to be filled into the slots, it is possible to provide a plurality of dispensers. However, if only one slot 120 is defined, it is possible to provide only one dispenser correspondingly.

In additional, it should be noted that, the number of dispensing times of the dispenser may not be not limited in the present disclosure, and the dispenser may dispense the first material once or for multiple times. More specifically, the dispensing times of the dispensers may be determined in conjunction with the filling effect of the first material.

In addition, it should be noted that, a filling direction of the first material into the slot 120 may be changeable. For example, in one embodiment, the filling direction of the first material into the slot 120 may be substantially perpendicular to the first surface 111 or the second surface 112. In another embodiment, the filling direction may also be substantially parallel to the first surface 111 or the second surface 112. In a further embodiment, the filling direction may also be at an angle oblique to the first surface 111 or the second surface 112. Thus, the filling direction of the first material into the slot 120 may not be limited in the present disclosure. All filling directions that do not go against the technical idea of the present disclosure are considered to satisfy the conditions, and may be covered within the protection scope of the present disclosure.

Figure 15:
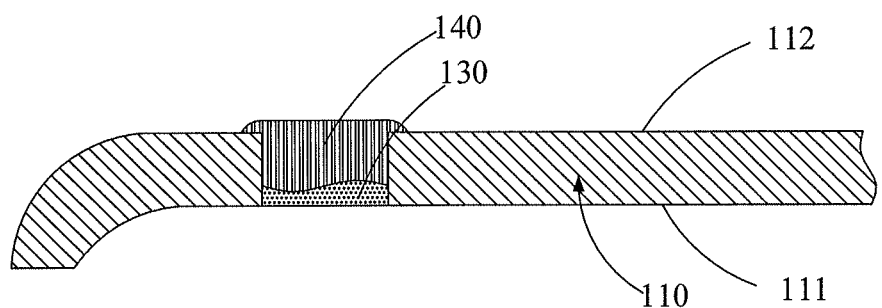

At block 230: a second material may be filled into the slot 120 to fill up the slot 120, as shown in FIG. 15. More specifically, the second material may be filled into the slot 120 along the direction from the second surface 112 to the first surface 111, and further cover the first material.

In this embodiment, the filling amount of the first material may be less than the filling amount of the second material. After the first material is filled into the slot 120, since a small amount of the first material is filled, and the first material will not occupy the whole space of the slot 120, more space may be left in the slot 120. Besides, both the first material and the second material may also be the liquid glue, and the viscosity of the first material may be less than the viscosity of the second material. In this way, the first material may have a better fluidity than the second material, such that the first material may flow to any corner (such as the chamber, the recess, and the like) below the lower portion of the slot 120, thereby reducing the defects, including the bubble, the poor sealing, the glue leakage, and the like resulted in the process of filling the slot 120.

In this embodiment, the first material may include the material the same as or different from the material included in the second material. Alternatively, the first material may be compatible with the second material, such that the connection strength between the first material and the second material may be enhanced.

Alternatively, the filling amount of the first material may be 0.1-0.8 times of the filling amount of the second material.

Alternatively, the filling amount of the second material may be further increased. For example, as shown in FIG. 15, the second material may overflow out of the slot 120, which means, a distance from the outer surface of the second material to the first surface 111 may be greater than a distance from the second surface 112 to the first surface 111. In this way, it is possible to ensure that the filling amount of the second material is sufficient, avoid the problems of glue leakage and glue shortage, and ensure the sealing performance of the cover body 110.

In this embodiment, the filling method of the second material may be similar to those described in the first material, and may not be described in details any more.

Alternatively, before the block 220, the method may further include the block: roughening the inner surface 121 of the slot 120. When filling the first material and the second material into the slot 120, the inner surface 121 of the slot 120 may contact with the first material and the second material. By roughening the inner surface 121, it is possible to improve the adhesion between the first material and the slot 120 and between the second material and the slot 120, during the filling process of the first material and the second material. In this way, it is possible to ensure that a sufficient amount of the first material and a sufficient amount of the second material may be provided, thereby ensuring the sealing performance of the cover body 110. Besides, the connection between the cover body 110 and the first material, and that between the cover body 110 and the second material may be more stably.

Alternatively, in one embodiment, it is possible to roughen only a first portion of the inner surface 121 that contacts with the first material, and keep a second portion of the inner surface 121 that contacts with the second material smooth. In this way, when filling the first material in the slot 120, it is possible to enhance the adhesion between the first material and the slot 120, and ensure that a sufficient amount of first material is filled. However, since the second portion of the inner surface 121 that contacts with the second material is smooth, the second material may flow smoothly in the slot 120. In this way, it is possible to ensure the sealing performance of the cover body 110.

Alternatively, in another embodiment, it is possible to roughen only the second portion of the inner surface 121 that contacts with the second material, and keep the first portion of the inner surface 121 that contacts with the first material smooth. In this way, when filling the first material in the slot 120, a small resistance may be generated between the slot 120 and the first material, and the first material may flow smoothly. In this way, it is possible to ensure that a sufficient amount of first material is filled. However, since the second portion of the inner surface 121 that contacts with the second material is roughened, it is possible to enhance the adhesion between the second material and the slot 120, and ensure that a sufficient amount of second material is filled. In this way, it is possible to ensure the sealing performance of the cover body 110.

Further, after the block 230, an inner cavity, a periphery, and features of the cover body 110 may be processed by using the CNC lathe. In this case, the features may include, but be not limited to a camera receiving hole, a headphone jack, a power line jack, and the like. The cover body 110 may be polished, sandblasted, and anodized, to change a color and a luster of the cover body 110, thereby forming the housing 100.

Figure 16:
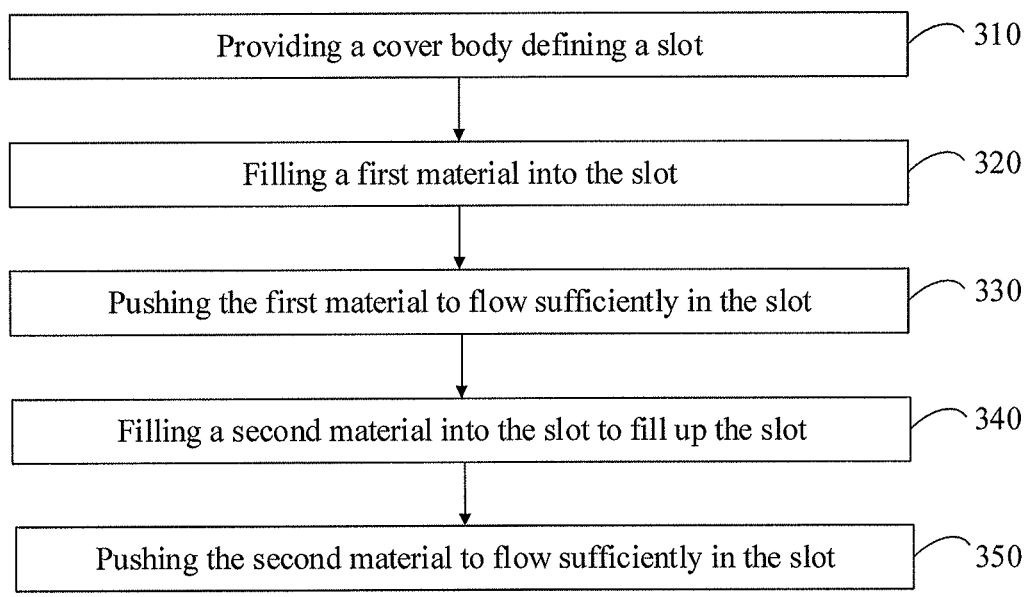
FIG. 16 illustrates a flow chart illustrating a method for manufacturing the housing according to another embodiment of the present disclosure.

FIG. 16 illustrates a flow chart illustrating a method for manufacturing the housing according to another embodiment of the present disclosure. The method in this embodiment may substantially include the following blocks.

At block 310: a cover body 110 defining a slot 120 may be provided.

At block 320: a first material may be filled into the slot 120.

Herein, in this embodiment, the block 310 may be the same as the block 210, and the block 320 may be the same as the block 220. Thus, the blocks 310 and 320 will not be described in detail any more.

At block 330: the first material may be pushed to flow sufficiently in the slot 120.

In one implementation, the block 330 may be achieved by blowing gas to the first material in the slot 120, such that the first material may be pushed to flow sufficiently in the slot 120. In this way, it is possible to ensure that the first material may sufficiently flow to any corner of the slot 120.

Alternatively, the gas may include, but be not limited to air, hydrogen, nitrogen, and the like, as long as the gas will not react with the first material.

Alternatively, a blowing device of the gas may be a gas blower, a high-pressure nozzle, a gas gun, and the like. However, the methods for achieving the gas blowing may not be limited in the present disclosure. All methods for achieving the gas blowing that do not go against the technical idea of the present disclosure are considered to satisfy the conditions, and may be covered within the protection scope of the present disclosure.

In addition, it should be noted that, the number of blowing devices may not be limited in the present disclosure. One blowing device or a plurality of blowing devices may be provided in the present disclosure. More specifically, the number of the blowing devices may be determined in conjunction with the filling effect of the first material.

In addition, it should be noted that, the number of blowing times may not be limited in the present disclosure. The gas may be blown to the first material in the slot once or repeatedly. More specifically, the number of blowing times may be determined in conjunction with the filling effect of the first material.

In addition, it should be noted that, a blowing direction may be changeable. For example, in one embodiment, the blowing direction may be substantially perpendicular to the first surface 111 or the second surface 112. In another embodiment, the blowing direction may also be substantially parallel to the first surface 111 or the second surface 112. In a further embodiment, the blowing direction may also be at an angle oblique to the first surface 111 or the second surface 112. Therefore, the blowing direction may not be limited in the present disclosure. All blowing directions that do not go against the technical idea of the present disclosure are considered to satisfy the conditions, and may be covered within the protection scope of the present disclosure. For example, if the slot 120 extends in a certain direction (in this embodiment, the extension direction may be the thickness direction of the cover body 110), the gas may be blown into the slot 120 along the extension direction (e.g., thickness direction of the cover body 110). In this way, the first material may flow along the extension direction, and thus the slot 120 may be rapidly filled with the first material.

Alternatively, the dispensing process of the first material into the slot 120 and the gas blowing process may be performed at the same side of the cover body 110, such that the dispensing process and the gas blowing process can be completed in narrow space, thereby avoiding the dispenser and the gas blowing device from occupying large space, and increasing the flexibility of operation. Of course, it is possible that the dispensing process and the gas blowing process may be performed at opposite sides of the cover body 110.

In another implementation, the block 330 may be achieved by applying a pressure to the first material. In this way, the bubble in the slot 120 may be discharged.

More specifically, the first material may be applied with the pressure by using, but being not limited to a pressurizing device, such as a booster pump. When the first material is applied with a pressure, the first material may flow sufficiently in the slot, such that the bubble in the first material may be discharged, and the first material may be filled into the slot 120 more closely. In this way, the problems of the glue leakage, the glue shortage, and the like may be prevented from occurring. Therefore, the filling quality of the first material in the slot 120 may be improved, and the sealing effect of the cover body 110 may also be improved.

In the above implementation, the pressure applying process and the gas blowing process are two processes which are performed independently. For example, one skilled in the art may use only the pressure applying process or the gas blowing process to push the first material to flow sufficiently in to the slot 120, in order ensure the filling effect of the first material.

However, in other implementations, it is also possible to combine the pressure applying process with the gas blowing process. For example, it is possible to blow gas to the first material at the same time of applying a pressure to the first material. It is also possible to blow gas to the first material firstly, and apply a pressure after a preset period of time. It is also possible to apply a pressure to the first material firstly, and blow gas after a preset period of time. That is to say, the combination of the pressure applying process with the gas blowing process can be achieved by some more implementations. All these implementations that do not go against the technical idea of the present disclosure are considered to satisfy the conditions, and may be covered within the protection scope of the present disclosure.

At block 340: a second material may be filled into the slot 120 to fill up the slot 120. The block 340 may be the same as the block 230, and will not be described in detail any more.

At block 350: the second material may be pushed to flow sufficiently in the slot 120.

In this embodiment, the block 350 may also be achieved by: blowing gas to the second material filled in the slot 120, and/or applying a pressure to the first material. In this way, the bubble generated in the second material may be discharged, and the slot 120 may be filled up.

In this embodiment, the gas blowing process and the pressure applying process may be similar to those described in the first material, and may not be described in details any more.

In one embodiment, it is possible to blow gas to the first material firstly, and then cure the first material. After that, the second material may be filled into the slot 120, and the second material may be applied with a pressure before it is cured. However, in another embodiment, it is also possible to apply a pressure to the first material firstly, and then cure the first material. After that, the second material may be filled into the slot 120, and the gas may be blown to the second material before the second material is cured. Therefore, the sequences of the gas blowing process and the pressure applying process may not be limited in the present disclosure. Any operation method which does not go against the technical idea of the present disclosure is covered within the protection scope of the present disclosure.

It should be understood that, in one implementation, it is possible for the method to include one of the block 330 and the block 350. However, in another implementation, it is possible for the method to include both the block 330 and the block 350.

Figure 17:
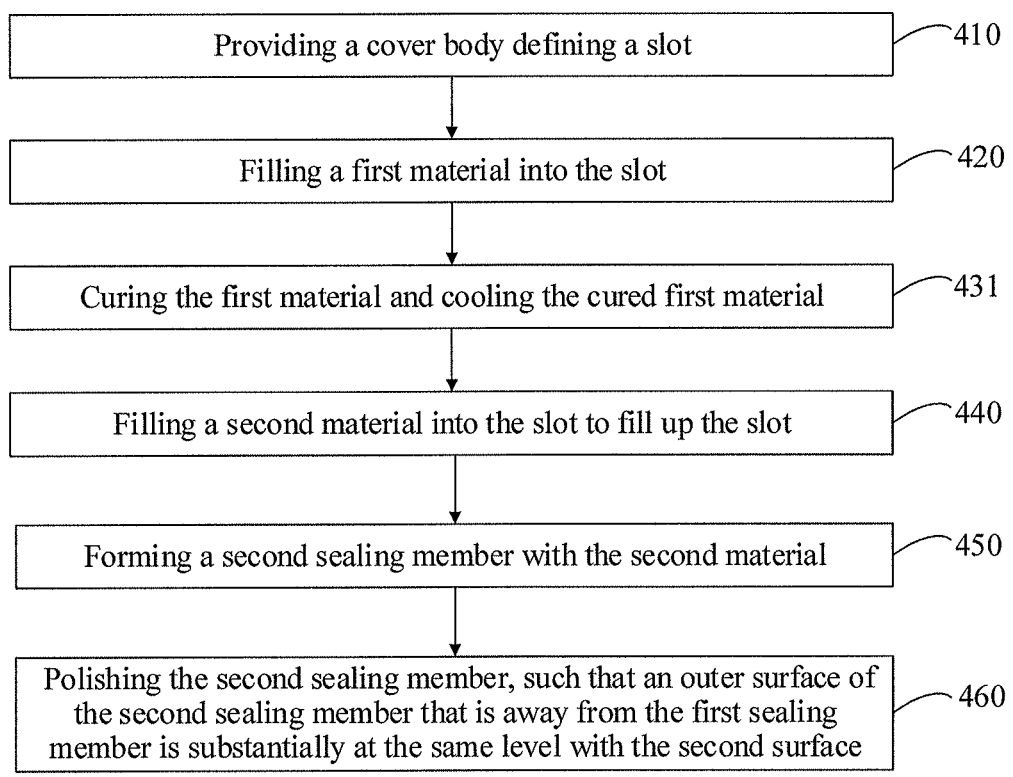
FIG. 17 illustrates a flow chart illustrating a method for manufacturing the housing according to a further embodiment of the present disclosure.

FIG. 17 illustrates a flow chart illustrating a method for manufacturing the housing according to a further embodiment of the present disclosure. The method in this embodiment may substantially include the following blocks.

At block 410, a cover body 110 defining a slot 120 may be provided.

At block 420: a first material may be filled into the slot 120.

Herein, in this embodiment, the block 410 may be the same as the block 210, and the block 420 may be the same as the block 220. Thus, the blocks 410 and 420 will not be described in detail any more.

At block 430: a first sealing member 130 may be formed with the first material.

In one embodiment, the block 430 may be achieved by the block 431: the first material may be cured, and the cured first material may be cooled. In this way, the first sealing member 130 may be formed.

Alternatively, in one implementation, the first material may be cured by means of a thermal curing process. Thermal curing is a process in which the materials have changes in physical properties by means of chemical reactions, or heating with or without pressure. During the thermal curing process, the thermal curing may be performed at a temperature of 80~110° C. The selected temperature suitable for curing should be as low as possible, in order to avoid the first material from cracking, shrinkage deforming, or being separated from the inner surface of the slot 120 due to an excessively high curing temperature. Alternatively, the curing time may be 0.5~2 h. If the curing time is too short, the first material may not be completely cured. However, if the curing time is too long, the first material may also be cracked and deformed.

In another implementation, the first material may be cured by means of an ultraviolet (UV) curing process. UV curing is a process in which ultraviolet lights and visible lights may be used to initiate a photochemical reaction that generates a crosslinked network of polymers. However, the curing method may not be limited in the present disclosure. In fact, any process suitable for curing the first material may be adopted in the present disclosure, and the curing process of the first material will not be limited in the present disclosure.

Alternatively, the cured first material may be cooled to 20~40° C., such that the first sealing member 130 may be at a temperature at 20~40° C. In this way, when a second material is filled in the slot later and contacts with the first sealing member 130, if the temperature of the first sealing member 130 is too high, the temperature of the second material may be suddenly increased. In this way, the second material may have a poor fluidity and a poor contraction performance, thereby affecting the sealing performance of the housing 100.

Further, during the cooling process of the cured first material, the cured first material may be cooled at a cooling rate of 0.1~0.8° C./min. That is, the temperature may be decreased at a slow speed. In this way, it is possible to ensure that the first sealing member 130 may have no contraction or less contraction during the cooling process thereof, thereby ensuring that the first sealing member 130 may keep being attached to the inner surface 121 of the slot 120, and improving the sealing effect of the housing 100.

After cured, the first material may have a large density, and thus the first sealing member 130 may be formed. The first sealing member 130 may be closely adhered to the lower portion of the slot 120. In this way, defects present between the first sealing member 130 and the lower portion of the slot 120, such as the chamber, the bubble and the like may be reduced, thereby avoiding the problems such as cracks in the sealing member, the glue leakage, poor sealing, and the like, caused by the defects including the chamber, the bubble, and the like. Further, the first sealing member 130 may have the waterproof and dustproof functions, thereby proving a certain degree of sealing protection to the cover body 110.

At block 440: a second material may be filled into the slot 120 to fill up the slot 120. The block 440 may be the same as the block 230, and will not be described in detail any more.

In this embodiment, after the first sealing member is formed, the second material may be filled into the slot 120 along the direction from the second surface 112 to the first surface 111. In this case, the second material may be disposed on the first sealing member 130 by means of coating or spraying for example, and the second material may cover the first material, and more specifically cover at least parts of the first sealing member 130. The first sealing member 130 may support the second material, such that the second material in the slot 120 may have sufficient time for curing. In this way, the second material may provide a good sealing effect, the sealing quality of the whole cover body 110 may be ensured, and the sealing performance of the mobile terminal 10 may be in turn ensured.

Alternatively, the second material may completely cover the surface of the first sealing member 130.

At block 450: a second sealing member 140 may be formed with the second material. In this way, the first sealing member 130 may seal the first opening 113, while the second sealing member 140 may seal between the first sealing member 130 and the second opening 114. The slot 120 may be filled up with the first sealing member 130 and the second sealing member 140.

In one embodiment, after the second material is filled in the slot 120, the second material may be cured, and the cured second material may be further cooled such that the second sealing member 140 may be formed. Likewise, in one implementation, the second material may be cured by means of a thermal curing process. During the thermal curing process of the second material, the thermal curing may be performed at a temperature of 80~110° C. for 1~3 h, such that the second material may be fully cured. Further, the cured second material may be cooled to a room temperature by any suitable means. Of course, in another embodiment, the cured second material may not be cooled.

At block 460: the second sealing member 140 may be polished, such that an outer surface (i.e., the second upper surface 141) of the second sealing member 140 that is away from the first sealing member 130 may be substantially at the same level with the second surface 112 of the cover body 110.

Alternatively, machining methods, such as lathing, milling, grinding, cutting, and the like may be used by the CNC machine for polishing of the second sealing member 140, such that the outer surface (i.e., the second upper surface 141) of the second sealing member 140 may be substantially at the same level with the second surface 112 of the cover body 110.

Figure 18:
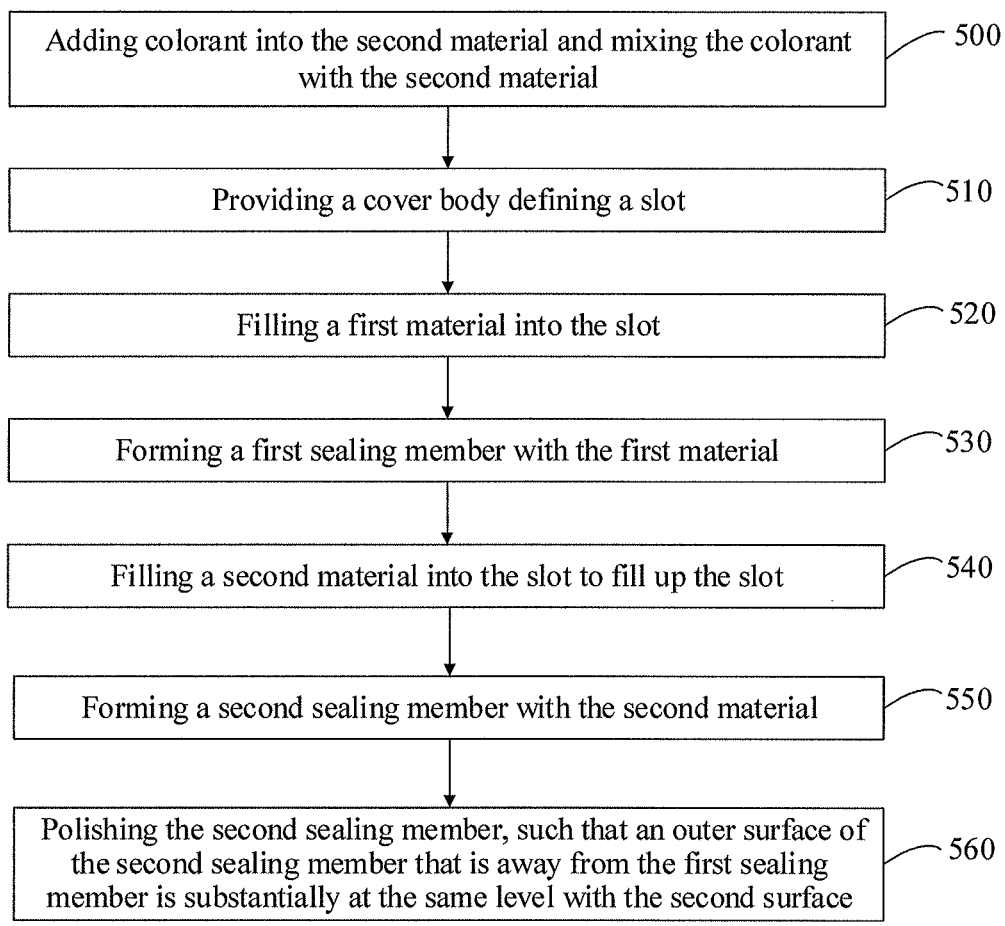
FIG. 18 illustrates a flow chart illustrating a method for manufacturing the housing according to still a further embodiment of the present disclosure.

FIG. 18 illustrates a flow chart illustrating a method for manufacturing the housing according to still a further embodiment of the present disclosure. The method in this embodiment may be substantially the same as the method described in FIG. 17, and may include the following blocks.

At block 500: colorant may be added into the second material and mixed with the second material.

At block 510, a cover body 110 defining a slot 120 may be provided.

At block 520: a first material may be filled into the slot 120.

At block 530: a first sealing member 130 may be formed with the first material.

At block 540: a second material may be filled into the slot 120 to fill up the slot 120.

At block 550: a second sealing member 140 may be formed with the second material.

At block 560: the second sealing member 140 may be polished, such that an outer surface of the second sealing member 140 that is away from the first sealing member 130 may be substantially at the same level with the second surface 112 of the cover body 110.

Herein, in this embodiment, the blocks 510-560 may be the same as the blocks 410-460. Thus, the blocks 510-560 will not be described in detail any more.

In this embodiment, since colorant is added into the second material and mixed with the second material, after the second material is cured and the sealing member 160 is formed, a colored encapsulation band may be formed in the slot 120, which may serve as a marker and a decoration. In addition, by adding the colorant added the second sealing member 140, the formed colored encapsulation band may have a color consistent with that of the housing 100. In this way, after the housing 100 has been manufactured, it is possible to ensure a uniformity in appearance of the housing 100.

In this embodiment, the block 500 is performed before the block 510. However, it will be appreciated that, this block 500 may be performed before the block 520, 530 or 540, or may be performed at the same time of performing the block 510, 520, 530 or 540. Thus, the performing sequence of the block 500 may not be limited in the present disclosure.

Figure 19:
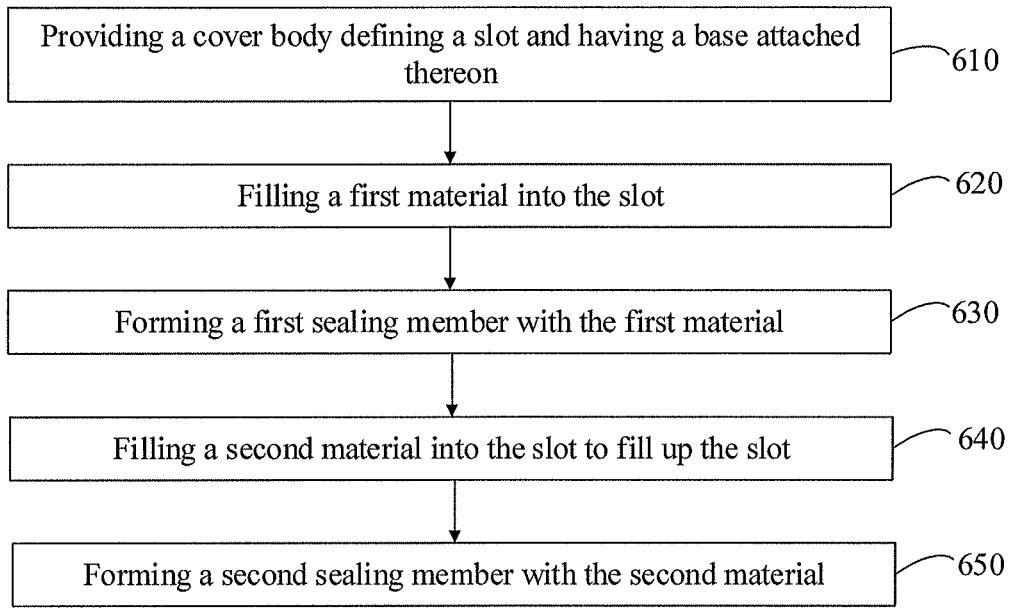
FIG. 19 illustrates a flow chart illustrating a method for manufacturing the housing according to still a further embodiment of the present disclosure.
Figure 20:
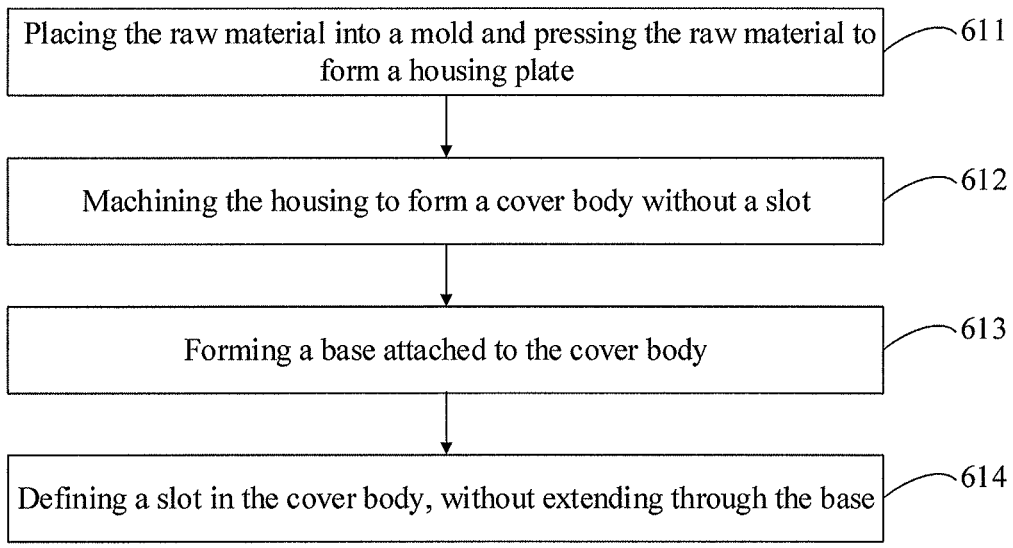
FIG. 20 illustrates a flow chart of the block 510 according to one embodiment of the present disclosure.

FIG. 19 illustrates a flow chart illustrating a method for manufacturing the housing according to still a further embodiment of the present disclosure. FIG. 20 illustrates a flow chart of block 610 according to one embodiment of the present disclosure. In this embodiment, the housing 100 may include a chamber 150 configured to cover the slot 120. In this embodiment, the base 150 may be formed before the slot 120 is defined in the cover body 110. More specifically, as shown in FIGS. 19-20, the method may include the following blocks.

At block 610: a cover body 110 defining a slot 120 and having a base 150 attached thereon may be provided.

In one implementation, referring to FIG. 19, the block 610 may include the following blocks.

At block 611: raw material (a piece of metal) may be placed into a mold and pressed, in order to form a housing plate; the housing plate may have an even thickness. It will be appreciated that, the raw material may be pressed once or many times before the housing plate is formed. Alternatively, before the raw material is placed into the mold, the raw material may be cut.

At block 612: the housing plate may be machined, in order to form a cover body 110 without a slot. In this embodiment, the housing plate may be machined by using the CNC machine. Certainly, in other embodiment, the housing plate may be machined by using other apparatus.

The blocks 611 and 612 may be substantially the same as the blocks 211 and 212, and will not be described in detail any more.

At block 613: the base 150 attached to the cover body 110 may be formed. More specifically, the cover body 110 may be placed in a mold, and plastic material may be injected into the mold, such that the plastic material may be formed into the base 150 attached to the first surface 111 of the cover body 110.

In this embodiment, as described above, the base 150 may be made of, but be not limited to plastic materials such as rubber, resin, and the like. The plastic materials may be injected into the mold, and attached to the first surface 111 closely. In this way, the base 150 is thereby formed.

At block 614: a slot 120 may be defined in the cover body 110 without extending through the base 150. That is to say, the base 150 may not be cut through during the defining process of the slot 120, such that the slot 120 extents through the cover body, but not through the base 150. In this embodiment, the cover body 110 may be placed in the CNC machine, and the antenna slot 120 may be defined in the cover body 110 by using such as a milling cutter.

In this embodiment, the base 150 is formed before the slot 120 is defined in the cover body 110. In this way, the base 150 may be used to support the cover body 110. When a plurality of antenna slots 120 need to be formed, the base 150 may help to keep the cover body 110 from bending or deforming during the milling process of two adjacent antenna slots 120.

At block 620: a first material may be filled into the slot 120.

When the housing 100 includes the base 150, the block 620 may be achieved by: disposing the first material on the base 150. In this case, the first material may be disposed on the base 150 by means of such as coating, spraying, and the like.

Alternatively, in one implementation, as shown in FIGS. 7-8, at least one chamber 151 communicating with the slot 120 may be defined in the housing 100 during the forming of the base 150, and the at least one chamber 151 may be defined by the base 150 and the cover body 110. The disposing the first material on the base 150 may be achieved by: disposing the first material on the base 150 such that the first material may flow into the at least one chamber 151 and be further filled in the at least one chamber 151. That is to say, the at least one chamber 151 may be filled with the first material. In this implementation, the at least one chamber 151 may be left artificially, or may be formed since the base 150 is not closely attached to the cover body 110. The first material may be disposed on the base 150 by means of such as coating, spraying, and the like.

In another implementation, at least one recess 152 communicating with the slot 120 may be defined in the base 150. More specifically, the at least one recess 152 may be recessed from a surface of the base 150 that is oriented towards the slot 120, as shown in FIG. 9. In this case, the disposing the first material on the base 150 may be achieved by: disposing the first material on the base 150, such that the first material may flow into the chamber 151 and be further filled in the at least one recess 152. That is to say, the at least one recess 152 may be filled with the first material.

Since the first material has a good fluidity, and the at least one chamber or the at least one recess may receive the first material, it is possible to ensure that a sufficient amount of the first material may be filled into the slot 120, and the problems of glue leakage and shortage may be overcome.

At block 630: a first sealing member 130 may be formed with the first material.

At block 640: a second material may be filled into the slot 120 to fill up the slot 120.

At block 650: a second sealing member 140 may be formed with the second material.

In this embodiment, the blocks 630, 640 and 650 may be substantially the same as the blocks 530, 540 and 550, and will not be described in detail any more.

Figure 21:
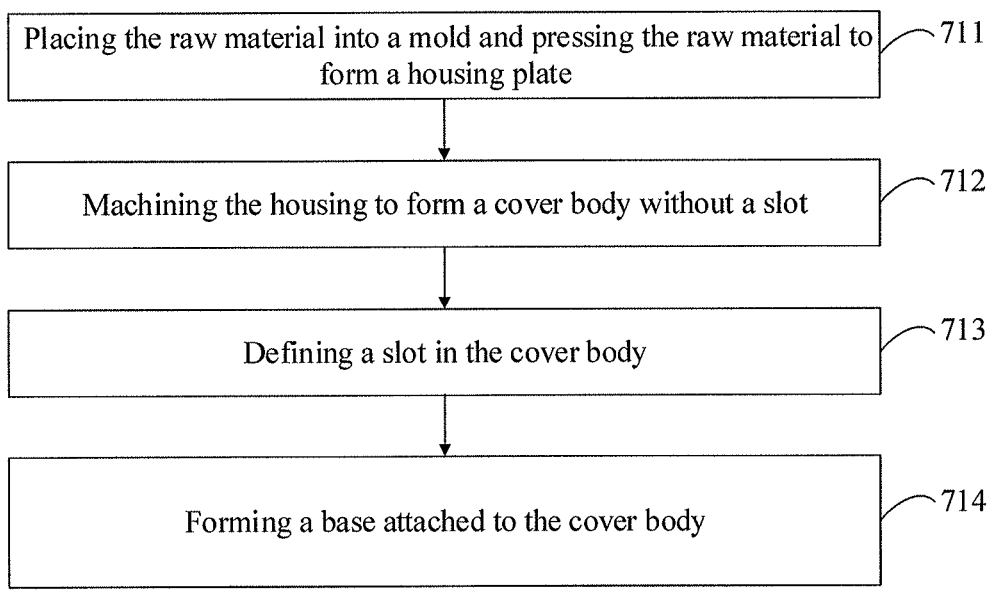
FIG. 21 illustrates a flow chart illustrating a method for manufacturing the housing according to still a further embodiment of the present disclosure.

FIG. 21 illustrates a flow chart illustrating a method for manufacturing the housing according to still a further embodiment of the present disclosure. The method described in this embodiment may be substantially the same as the method described in FIGS. 19-20, except that the base 150 may be formed after the slot 120 is defined in the cover body 110, that is to say, the forming process of the cover body 110 in this embodiment is different from that in the embodiment described with FIGS. 19-20. Thus, the same blocks will not be described in detail any more. As shown in FIG. 21, the block 610 may include the following blocks.

At block 711: raw material (a piece of metal) may be placed into a mold and pressed, in order to form a housing plate; the housing plate may have an even thickness.

At block 712: the housing plate may be machined, in order to form a cover body 110 without a slot.

At block 713: a slot 120 may be defined in the cover body 110.

The blocks 711, 712 and 713 may be respectively the same as the blocks 211, 212 and 213, and will not be described in detail any more.

At block 714: the base 150 attached to the cover body 110 having the slot 120 may be formed. More specifically, the cover body 110 may be placed in a mold, and plastic material may be injected into the mold, such that the plastic material may be formed into the base 150 attached to the first surface 111 of the cover body 110. In this embodiment, as described above, the base 150 may be made of, but be not limited to plastic materials such as rubber, resin, and the like. When injecting the plastic material into the mold, the slot may be protected from being blocked or injected with the plastic material, such that after the base 150 is formed, the cover body 110 may still have the slot 120 extending therethrough.

For one skilled in the art, it is clear that the present disclosure is not limited to the details of the above exemplary embodiments, and that the present disclosure can be implemented in other specific forms without deviating from the spirit or basic characteristics of the application. Therefore, at any point, the embodiments should be regarded as exemplary and unrestrictive, and the scope of the present disclosure is defined by the appended claims, rather than the above description. Therefore, all changes within the meaning and scope of the equivalent elements of the claim is intended to be included. Any appended label recited in the claims shall not be regarded as a limitation to the claims. In addition, apparently, the terms "include", "comprise" and the like do not exclude other units or steps, and the singular does not exclude plural.

It should be noted that, the foregoing disclosed is merely exemplary implementations and it is not intended to limit the scope of the present disclosure. Although the present disclosure is described in details with reference to the above embodiments, however, one skilled in the art may make any modification or equivalence based on the technical solution and the inventive concept of the present disclosure. All these modifications and equivalences shall all be covered within the protection claimed in the claims of the present disclosure.

What is claimed is:

1. A method for manufacturing a housing, comprising:
providing a cover body defining a slot; wherein the cover body comprises a first surface and a second surface opposite to each other;
filling a first material into the slot; and
filling a second material into the slot to fill up the slot;
wherein the first surface is an inner surface that is oriented towards components received in the housing, the first material is located closer to the first surface than the second material, and a filling amount of the first material is less than a filling amount of the second material;
wherein before filling the second material into the slot, the method further comprises: forming a first sealing member with the first material.

2. The method of claim 1, wherein
the filling the second material into the slot comprising: disposing the second material on the first sealing member and covering the first sealing member; and
after filling the second material into the slot, the method further comprising: forming a second sealing member with the second material.

3. The method of claim 2, the forming the first sealing member with the first material comprising: curing the first material and cooling the cured first material; and
the forming the second sealing member with the second material comprising: curing the second material.

4. The method of claim 1, wherein the slot extends through the cover body from the first surface to the second surface along a thickness direction of the cover body;
wherein filling the first material into the slot comprises: filling the first material into the slot along a direction from the second surface to the first surface, such that the first material is located closer to the first surface than the second material.

5. The method of claim 4, further comprising: polishing the second sealing member such that an outer surface of the second sealing member that is away from the first sealing member is substantially at the same level with the second surface of the cover body.

6. The method of claim 4, before filling the first material into the slot, further comprising: forming a base attached to the first surface and covering the slot on the cover body;
filling the first material into the slot comprising: disposing the first material on the base.

7. The method of claim 6, wherein at least one chamber communicating with the slot is defined by the base and the cover body;
wherein disposing the first material on the base at the first surface comprises: filling the at least one chamber with the first material.

8. The method of claim 6, wherein at least one recess communicating with the slot is defined in the base;
the disposing the first material on the base at the first surface comprises: filling the at least one recess with the first material.

9. The method of claim 1, further comprising at least one of:
blowing gas to at least one of the first material and the second material which are filled in the slot; and
applying a pressure to at least one of the first material and the second material.

10. The method of claim 1, before filling the second material into the slot, further comprising: adding colorant into the second material and mixing the colorant with the second material.

11. The method of claim 1, wherein
both the first material and the second material are liquid glue, and a viscosity of the first material is less than a viscosity of the second material.

12. A housing, comprising:
a cover body defining a slot, wherein the cover body comprises a first surface and a second surface opposite to each other; and
a first sealing member and a second sealing member arranged in the slot and configured to seal the slot; wherein the second sealing member is stacked on the first sealing member along a thickness direction of the cover body;
wherein the first surface is an inner surface that is oriented towards components received in the housing, the first sealing member is disposed closer to the first surface than the second sealing member, and a thickness of the first sealing member is less than a thickness of the second sealing member.

13. The housing of claim 12, wherein the slot extends through the cover body from the first surface to the second surface along the thickness direction of the cover body;
the second sealing member is located between the first sealing member and the second surface.

14. The housing of claim 13, further comprising a base attached on the first surface and covering the slot; wherein the first sealing member is disposed on the base.

15. The housing of claim 14, wherein at least one chamber communicating with the slot is defined in the housing; the chamber is defined by the base and the first surface, and the first sealing member is filled in the at least one chamber.

16. The housing of claim 14, wherein at least one recess communicating with the slot is defined in the base, and the first sealing member is filled in the at least one recess.

17. The housing of claim 14, wherein the second sealing member comprises an outer surface located at one side of the second sealing member that is away from the first sealing member; the outer surface is substantially at the same level with the second surface.

18. The housing of claim 13, wherein
the first sealing member comprises a first material, and the second sealing member comprises a second material; a viscosity of the first material is less than a viscosity of the second material.

19. The housing claim of claim 18, wherein the second sealing member further comprises colorant.

20. A mobile terminal, comprising a housing and an antenna received in the housing, wherein the housing comprises:
a cover body, comprising a first surface and a second surface opposite to each other, and defining a slot through which the antenna transmits signals; the slot extending through the cover body from the first surface to the second surface along the thickness direction of the cover body; wherein the first surface is an inner surface that is oriented towards components received in the housing; and
a first sealing member and a second sealing member arranged in the slot and configured to seal the slot; wherein the second sealing member is stacked on the first sealing member along a thickness direction of the cover body;

wherein the first sealing member is disposed closer to the first surface than the second sealing member, a thickness of the first sealing member is less than a thickness of the second sealing member, and the second sealing member is located between the first sealing member and the second surface;

the second sealing member comprises an outer surface located at one side that is away from the first sealing member; the outer surface is substantially at the same level with the second surface.

* * * * *